United States Patent [19]
Nii

[11] Patent Number: 5,378,901
[45] Date of Patent: Jan. 3, 1995

[54] HETEROJUNCTION BIPOLAR TRANSISTOR AND METHOD FOR PRODUCING THE SAME

[75] Inventor: Keita Nii, Kyoto, Japan
[73] Assignee: Rohm, Co., Ltd., Kyoto, Japan
[21] Appl. No.: 993,779
[22] Filed: Dec. 21, 1992

[30] Foreign Application Priority Data

Dec. 24, 1991 [JP] Japan .................. 3-341150

[51] Int. Cl.$^6$ ............... H01L 33/00; H01L 27/14; H01L 31/00
[52] U.S. Cl. ................... 257/77; 257/197; 257/198; 257/201
[58] Field of Search ............ 257/77, 197, 198, 201

[56] References Cited

U.S. PATENT DOCUMENTS

| | | | |
|---|---|---|---|
| 5,144,398 | 9/1992 | Morithita | 257/77 |
| 5,247,192 | 9/1993 | Nii | 257/197 |

FOREIGN PATENT DOCUMENTS

| | | | |
|---|---|---|---|
| 0374544 | 6/1990 | European Pat. Off. | 257/198 |
| 63-43359 | 2/1988 | Japan | 257/198 |
| 155862 | 3/1989 | Japan | 257/197 |
| 1140664 | 6/1989 | Japan | 257/197 |

OTHER PUBLICATIONS

Chang et al, 'GaSb-InAs-GaSb p-n-p heterojunction transistors. . .', IBM Tech vol. 22 No. 7, Dec. 79, p. 2952.
Sasaki et al '. . . Amorphous SiC:4 Emitter Heterojunction Bipolar Transistor', IEEE Elec Device Lttrs, vol EDL6 No 6, Jun. 88, pp. 724–725.

*Primary Examiner*—Jerome Jackson
*Assistant Examiner*—Stephen D. Meier
*Attorney, Agent, or Firm*—Nikaido, Marmelstein, Murray & Oram

[57] ABSTRACT

A heterojunction bipolar transistor includes a 3c-silicon carbide crystal layer of a first conductive-type, a silicon crystal layer of a second conductive-type and another 3c-silicon carbide crystal layer which are sequentially formed to define a stair-like configuration on a substrate. The two 3c-silicon carbide crystal layers serve as a collector region and an emitter region, respectively while the silicon crystal layer of a second conductive-type serve as a base region. Each step of the stair-like configuration is formed thereon with an electrode for the respective region. In the above-mentioned transistor, an injection of positive holes or electrons which move from the base region to the collector region does not arise, hence only an amount of an electric accumulation in the base region determines the operation speed of the device.

1 Claim, 4 Drawing Sheets

HETEROJUNCTION BIPOLAR TRANSISTOR AND METHOD FOR PRODUCING THE SAME

BACKGROUND OF THE INVENTION

The present invention relates to a heterojunction bipolar transistor (hereinafter referred to as HBT) capable of rapidly operating. More particularly the present invention relates to a wide band gap HBT.

To make a conventional homojunction transistor operate rapidly, it is necessary to form a thin base region. However, the thin base region undesirably causes punching through. On the other hand, if the concentration of the base region is made high to prevent punching through, the gain of the transistor is lowered. Thus, there is a limit in realizing both high gain and rapid operation in conventional transistors.

In view of the above-mentioned circumstances, earnest studies on a Si(silicon)-HBT have been made to realize rapid operation in silicon bipolar transistors. As the Si-HBT which have been studied, there are wide-gap-emitter-type ones, wherein a material such as silicon carbide having a wider band gap than that of a silicon is applied to an emitter region, and narrow-gap-base-type ones, wherein a material such as mixed crystal of the silicon and a Ge having a narrower band gap than that of the silicon is applied to a base region.

In a conventional wide band gap HBT, a silicon semiconductor crystal is applied to a collector region and the base region, and 3c-SiC (3c-silicon carbide or β-SiC), which has a wider band gap than that of the silicon, is applied to the emitter region so that a emitter efficiency or injection efficiency increases and a base resistance decreases. Thus the conventional wide band gap HBT is used as an element for rapid operation and high power. These are disclosed in Japanese Unexamined Patent Publication No. 216364/1987.

However, the conventional wide band gap HBT, wherein the same semiconductor material (silicon) as that of the base region is applied to the collector region and an injection of positive holes that the positive holes move from the base to the collector are raised, has a problem that a large amount of positive holes accumulate in the collector region due to a comparatively thick collector region so that diode operation becomes tardy or late.

To overcome the above-mentioned problem, a HBT rapid operation has been disclosed in Japanese Patent Application No. 251918/1991, which corresponds to U.S. Pat. No. 5,247,192 wherein the collector region is also formed of a 3c-SiC crystal layer. More specifically, the HBT includes, as shown in FIG. 9, a 3c-SiC crystal layer 22 (collector region), a silicon crystal layer 23 (base region) and another 3c-SiC crystal layer 24 (emitter region) which are formed in this order in an opening defined in insulating films 25 and 27 covering a semiconductor substrate 21. A polysilicon film 26 is formed in advance between the insulating films 25, 27 for providing a connection between the base region 23 and a base electrode 28. The reason why such a constitution is developed is that the SiC crystal layer is hard to be etched with etching agent and hence severity in processing such as ion-milling is required even for removing unnecessary portions thereof. With a common constitution, upon processing the emitter region 24 the base region 23 is also processed undesirably, resulting in degradation in device characteristics.

To avoid such disadvantage attributable to the common constitution, the polysilicon film 26 is formed in advance to provide the connection between the base region 23 and the base electrode 28. In forming the base region 23, side faces thereof have to be coincident with the polysilicon film 26. For this reason, the thickness of the base region 23 needs to have somewhat of allowance. Thus the base region 23 cannot have such a thickness as to be required in a device characteristics.

In addition, there is a limitation to a certain degree in controlling a thickness of the film of a semiconductor crystal layer epitaxially grown. As a result of the above-mentioned fact that the base region 23 cannot be made sufficiently thin, there arises a problem that the desired device is prevented from rapidly operating.

SUMMARY OF THE INVENTION

In view of the above-mentioned circumstances, an object of the present invention is to provide a heterojunction bipolar transistor of the structure having a 3c-SiC crystal layer, a silicon crystal layer and a 3c-SiC crystal layer, wherein the silicon crystal layer serving as the base region is made sufficiently thin, and a method for producing the same.

In accordance with the present invention, there is provided a heterojunction bipolar transistor comprising a 3c-silicon carbide crystal layer of a first conductive-type, a silicon crystal layer of a second conductive-type and another 3c-silicon carbide crystal layer which are sequentially formed to define a stair-like configuration on a substrate, wherein the two 3c-silicon carbide crystal layers serve as a collector region and an emitter region, respectively while the silicon crystal layer of a second conductive-type serves as a base region; and each step of the stair-like configuration is formed thereon with an electrode for the respective region.

In accordance with the present invention, there is also provided a method for producing a heterojunction bipolar transistor comprising the steps of: epitaxially growing a 3c-silicon carbide crystal layer of a first conductive-type; forming a dummy layer on the 3c-silicon carbide crystal layer, removing a predetermined portion of the dummy layer by etching to expose a corresponding portion of the 3c-silicon carbide crystal layer and epitaxially growing another 3c-silicon carbide crystal layer of a first conductive-type on the dummy layer using as a seed the exposed portion of the 3c-silicon carbide crystal layer priorly formed; forming a passivation film to cover the surface of a resultant structure and removing by etching the dummy layer existing in a base formation region to form a cavity; epitaxially growing a silicon crystal layer within the cavity; removing a 3c-silicon carbide portion which is vertically grown from the seed and plugging the removed portion with an insulator; and forming electrodes for emitter, base and collector regions, respectively.

According to the method of the present invention, the SiC crystal layers for collector region and emitter region are formed with sandwiching the dummy layer, and then the dummy layer is removed by etching, followed by epitaxial growth of the silicon crystal layer between the SiC crystal layers. Accordingly, the thickness of the base region is determined by that of the dummy layer. Since the thickness of the dummy layer is controllable with good precision, the base region can desirably be made thinnest possible.

Further, according to the method of the present invention, the SiC crystal layers can be processed prior to the formation of the silicon crystal layer serving as base region. This allows the collector, base and emitter regions to form the stair-like configuration by varying stepwise the lateral length of those regions. In addition, the base electrode can be made in direct contact with the upper face of an end portion of the base region. Hence, it is unnecessary to give an allowance or margin to the thickness of the base region for providing a connection between the base region and the base electrode. This contributes to a desirable HBT arrangement having sufficiently thin base region.

DETAILED DESCRIPTION

Figure 1:
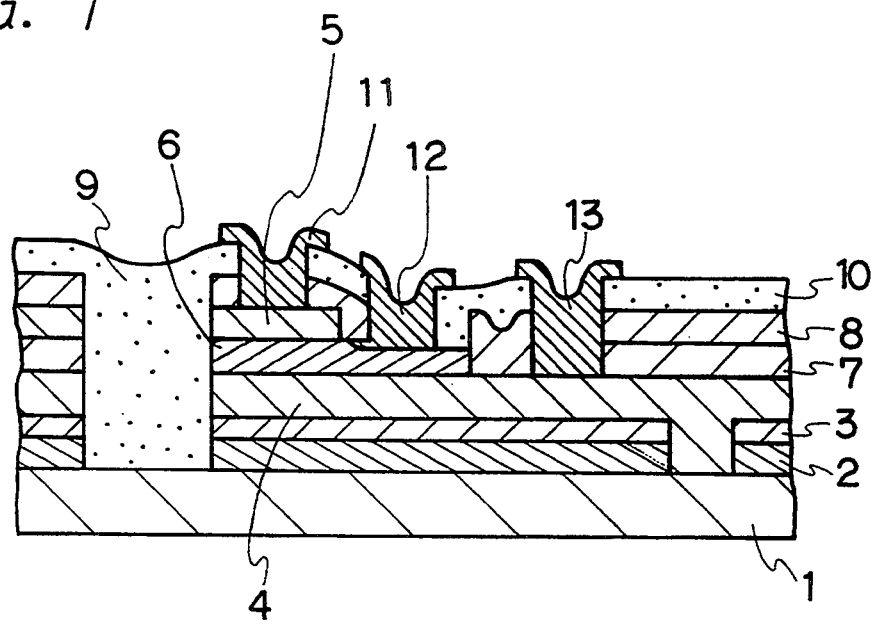
FIG. 1 is a schematic sectional view illustrating an embodiment of a HBT according to the present invention.

The present invention will hereinbelow be described in more detail with reference to the drawings. FIG. 1 is a schematic sectional view illustrating an embodiment of a HBT according to the present invention.

Referring to FIG. 1, denoted by numeral 1 is a semiconductor substrate such as of a p-type silicon, by numeral 2 a $SiO_2$ film, by numeral 3 a $Si_3N_4$ film, by numeral 4 a lower 3c-SiC crystal layer of a n-type which serves as a collector region of the HBT, by numeral 5 an upper 3c-SiC crystal layer of n-type which serves as emitter region of the HBT, a crystal layer of p-type which is sandwiched by the lower and upper 3c-SiC crystal layers 4 and 5, serves as a base region of the HBT, and the upper 3c-SiC crystal layer 5, a silicon crystal layer 6, and the lower 3c-SiC crystal layer 4 are formed so as to have a stair-like- shade in section. As a result, a base electrode can be provided on the silicon crystal layer 6. Numerals 7, 8 and 9 denote a $SiO_2$ film, a $Si_3N_4$ film and a SOG film, respectively. Denoted by numeral 10 is a $SiO_2$ film formed by a plasma CVD and serving as a passivation film. Numerals 11, 12 and 13 denote aluminum wiring lines serving as an emitter, a base and a collector electrodes, respectively.

In this structure, the $SiO_2$ film 7 is formed as a dummy layer for formation of the base region 6. The film 7 is formed of any material which is different from that of the $Si_3N_4$ film 8 and can be selectively etched. Further, the materials for the passivation film 10, wiring lines for electrodes and the like are not limited to those used in the embodiment. With respect to the above embodiment, the HBT is an n-p-n type transistor. However, a p-n-p type transistor can be formed in the same manner as the above embodiment.

The arrangement of the HBT according to the present invention is characterized in that the 3c-SiC crystal layer of a first conductive-type, the silicon crystal layer of a second conductive-type and the other 3c-SiC crystal layer of a first conductive-type form a stair-like configuration, and the two 3c-Si crystal layers serve as the collector and the emitter regions, respectively while the silicon crystal layer serves as the base region, thereby to form a double-heterojunction vertical transistor. It is also characterized in that the electrodes are each made in direct contact with the corresponding regions.

By virtue of the above arrangement, the emitter injection efficiency is improved because each of the 3c-SiC crystal layers serving respectively as the collector and the emitter regions has a band gap wider than that of the silicon crystal layer serving as the base region. In addition, the wide band gap of the collector region enables to prevent an injection of positive holes (or electrons in a pnp transistor) that the positive holes move from the base region to the collector region from causing. Furthermore, the device can realize not only low resistance by virtue of forming the base region with high concentration but also a rapid device operation by virtue of forming the base region with the smallest thickness, to adapt the device for high-frequency operation.

Next, an example of a method for producing a HBT according to the present invention will be described. FIGS. 2 to 7 each illustrate a step of the production process.

Figure 2:
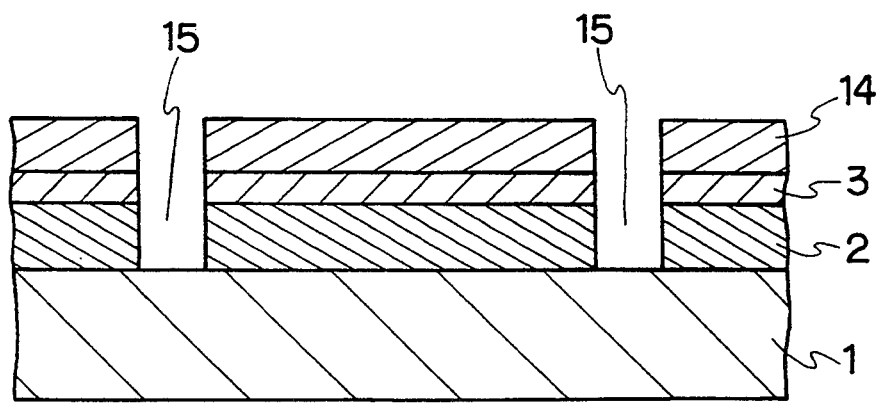
FIGS. 2 to 8 are each an explanatory view illustrating each step in producing an embodiment of a HBT according to the present invention.
Figure 3:
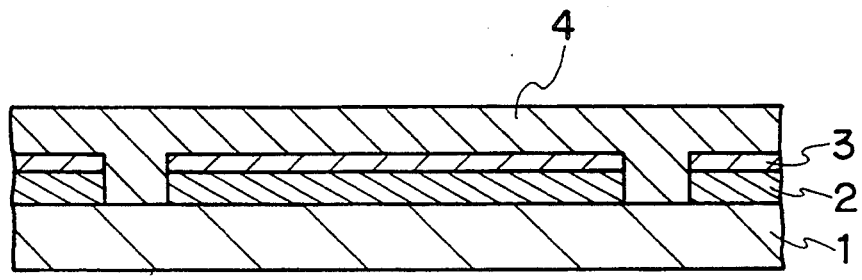

As shown in FIGS. 2 and 3, a 3c-SiC crystal layer is formed on a substrate. In an exemplary case, a p-type silicon substrate 1 was heat-treated at 950° C. for about 30 minutes to form a $SiO_2$ film 2 of 2000Å in thickness, followed by deposition of a $Si_3N_4$ film 3 of 500Å in thickness thereon by CVD. Subsequently a resist film 14 was formed, and then a first opening 15 was formed in the $SiO_2$ film 2 and the $Si_3N_4$ film 3 by selectively etching a part of these films using a reactive ion etching technique (hereinafter referred to as "RIE") wherein a $CF_4$ gas and an $O_2$ gas were made to flow. In turn a vapor deposition is carried out for 30 minutes in accordance with the CVD method wherein a $SiH_4$ gas and a $C_3H_8$ gas as source gas are introduced respectively at 5 sccm into a reactor furnace in which the substrate temperature is set to about 1100° C. In the exemplary case, the $PH_3$ gas as a dopant was mixed with the source gases to form a n-type 3c-SiC layer 4 of 3000Å in thickness. Thereafter, the entire surface of the 3c-SiC layer 4 was covered with a SOG film which was then etched back by the RIE to planarize the surface.

Figure 4:
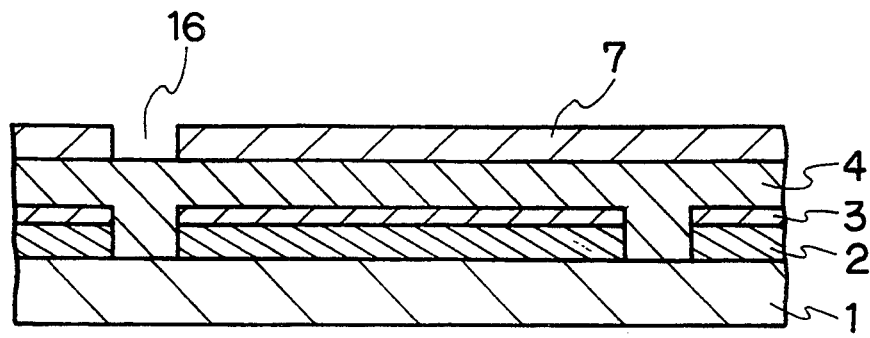

Next, as shown in FIG. 4, a dummy layer is formed on the surface of the 3c-SiC layer 4. In the exemplary case, the $SiO_2$ film 7 as a dummy layer was formed in 500Å thickness on the surface of the 3c-SiC layer 4 by heat treatment at 900° C. for about 10 minutes. Thereafter, a portion of the $SiO_2$ film 7 which existed above the aforementioned opening 15 was selectively etched with the use of photoresist mask to define a second opening 16.

Figure 5:
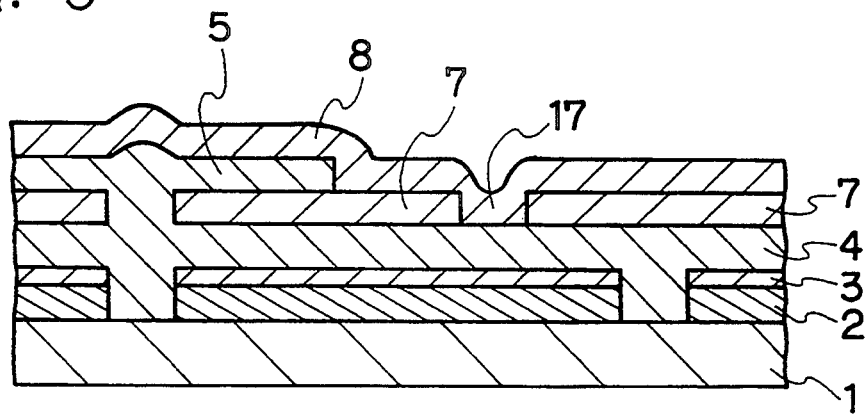

In turn, as shown in FIG. 5, using as seed the exposed potion of the 3c-SiC crystal layer in the second opening, another 3c-SiC crystal layer is epitaxially grown on the dummy layer. In the exemplary case a n-type 3c-SiC crystal layer 5 was grown in 3000Å thickness by performing the CVD for 30 minutes, wherein the $SiH_4$ gas and the $C_3H_8$ gas as source gas were introduced respectively at 5 sccm into a reactor furnace in which a substrate temperature was set to 1100° C., the $PH_3$ gas at 0.1 sccm being mixed with the source gases. The resulting 3c-SiC crystal layer was then subjected to the ion milling to remove unnecessary portions thereof, with retaining a predetermined width needed for the emitter region. Subsequently a $Si_3N_4$ film 8 was formed in 500Å thickness by the CVD method. In this case, a third opening was formed in advance in the $SiO_2$ film 7 or the dummy layer at the edge of the base region to be formed, and a boundary 17 is defined with the $Si_3N_4$ film 8.

Figure 6:
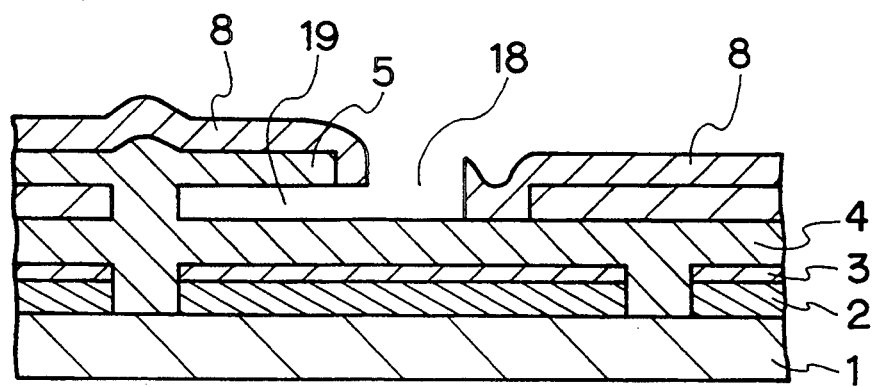

Next, as shown in FIG. 6, the dummy layer existing in the base formation region is removed by etching to form a cavity. In the exemplary case a fourth opening was formed by selectively etching a portion of the $Si_3N_4$ film 8 adjacent the boundary 17 in accordance with RIE method with the $CF_4$ gas and the $O_2$ gas being made to flow. Subsequently the $SiO_2$ film 7 or the dummy layer in the base formation region was etched away with a hydrofluoric acid. This resulted in a cavity 19 intermediate between the two 3c-SiC layers 4 and 5.

Figure 7:
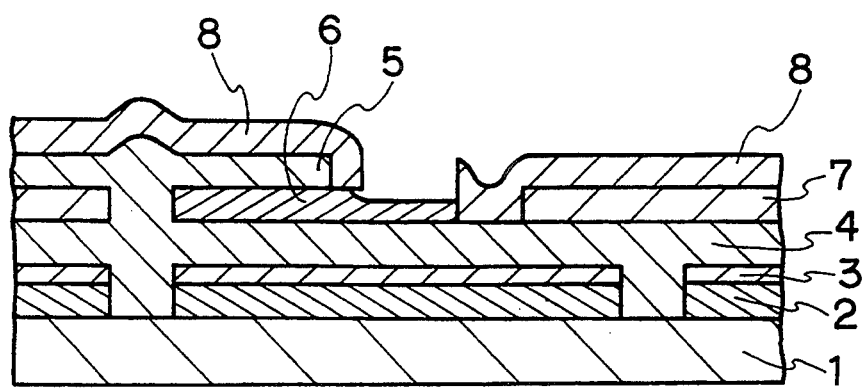

Next, as shown in FIG. 7, a silicon crystal layer is epitaxially grown within the cavity 19. In the exemplary case, a mixed gas of reaction gases $SiH_4$ and $B_2H_6$ at a rate of 100:1 was introduced into the reactor furnace in which the substrate temperature was set to 1150° C., to perform epitaxial growth for 5 minutes. This resulted in formation of a p-type silicon crystal layer within the cavity 19 intermediate between the 3c-SiC layers 4 and 5.

Finally, removed is the SiC crystal portion extending vertically from the substrate surface, which portion has been used as a seed for the epitaxial growth of the upper SiC crystal layer and the silicon crystal layer. The removed portion is then plugged with an insulator for electrically isolating from other devices on the same substrate. Thereafter, a passivation film is formed, followed by formation of the electrode wiring for each of the regions. Thus, the HBT as shown in FIG. 1 is completed.

Figure 8:
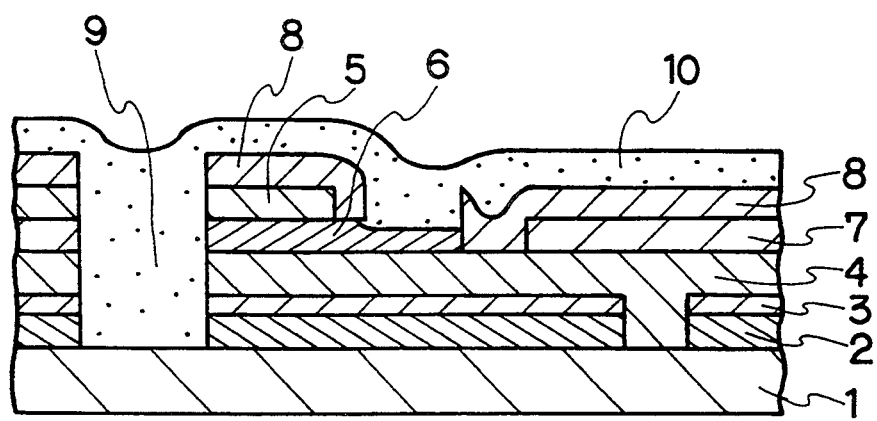
Figure 9:
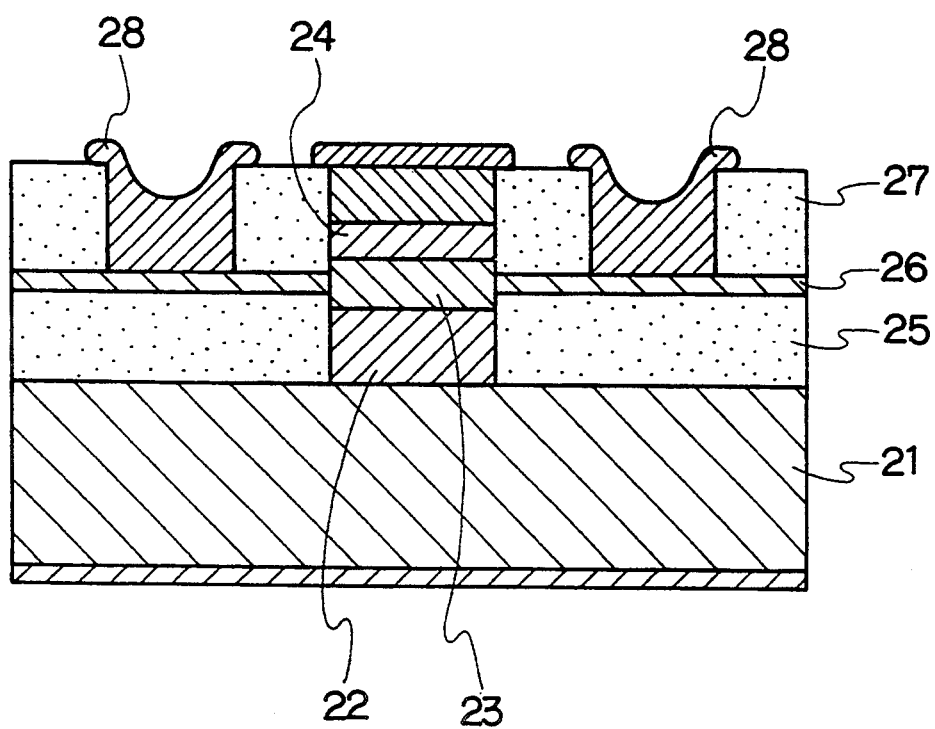
FIG. 9 is a schematic sectional view illustrating an example of a HBT wherein SiC crystal layers serve as an emitter and a collector regions, respectively.

In the exemplary case, the SiC crystal portion or the seed portion was removed to form a hole by the RIE method with other portions being protected with a resist film. The resulting hole was applied with the SOG, then annealed. In this case the application of the SOG was carried out twice and the SOG was etched back by the RIE so as to planarize rather uneven surface of the hole. The $SiO_2$ film was then deposited by plasma CVD method (refer to FIG. 8). Subsequently the $SiO_2$ film was subjected to the RIE for providing electrode contacts for emitter, base and collector, followed by sputtering an aluminum to form a metal film wiring of 5000Å in thickness.

As has been described, according to the present invention the 3c-SiC layers having a relatively wide energy band gap are used respectively as the emitter and collector regions, while the silicon crystal layer having a relatively narrow energy band gap is used as the base region. Accordingly, the injection of the positive holes or electrons that the positive holes move from the base region to the collector region are not raised, hence only an amount of an electric accumulation in the base region determines the operation speed of the device.

Besides, the base region can be formed thin because the base formation region is secured in advance by forming the dummy layer of film oxide by the CVD or a like method and the base region is formed after the formation of the emitter and collector regions.

Further, since all of the emitter, the collector and the base regions are formed by the epitaxial growth, a desirable impurity concentration profile can be set freely.

As a result, an improved HBT can be obtained wherein the base region is made thin and has a narrow band gap as compared with that of the collector or the emitter region. Such a HBT can operate rapidly, have a high amplification factor, and be adapted for use in high frequency band.

Though several embodiments of the present invention are described above, it is to be understood that the present invention is not limited only to the above-mentioned and various changes and modifications may be made in the invention without departing from the spirit and scope thereof.

What is claimed is:

1. A heterojunction bipolar transistor comprising: a 3c-silicon carbide crystal layer of a first conductive-type, a silicon crystal layer of a second conductive-type and another 3c-silicon carbide crystal layer which are sequentially formed to define a stair-like configuration on a substrate, wherein the two 3c-silicon carbide crystal layers serve as a collector region and an emitter region, respectively while the silicon crystal layer of a second conductive-type serve as a base region; and each step of the stair-like configuration is formed thereon with an electrode for the respective region.

* * * * *